(12) United States Patent
Nakata et al.

(10) Patent No.: US 7,235,866 B2
(45) Date of Patent: Jun. 26, 2007

(54) LOW DIELECTRIC CONSTANT FILM MATERIAL, FILM AND SEMICONDUCTOR DEVICE USING SUCH MATERIAL

(75) Inventors: Yoshihiro Nakata, Kawasaki (JP); Shun-ichi Fukuyama, Kawasaki (JP); Katsumi Suzuki, Kawasaki (JP); Ei Yano, Kawasaki (JP); Tamotsu Owada, Kawasaki (JP); Iwao Sugiura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 169 days.

(21) Appl. No.: 11/205,128

(22) Filed: Aug. 17, 2005

(65) Prior Publication Data

US 2006/0022357 A1 Feb. 2, 2006

Related U.S. Application Data

(62) Division of application No. 10/448,092, filed on May 30, 2003, now Pat. No. 6,958,525, which is a division of application No. 09/797,865, filed on Mar. 5, 2001, now Pat. No. 6,613,834.

(30) Foreign Application Priority Data

Mar. 29, 2000 (JP) ............... 2000-92138
Jan. 10, 2001 (JP) ............... 2001-2113

(51) Int. Cl.
H01L 23/58 (2006.01)
H01L 23/48 (2006.01)
(52) U.S. Cl. ............... 257/642; 257/759; 257/762
(58) Field of Classification Search ............... 257/639, 257/640, 642, 643, 751, 758–763, 752, 753
See application file for complete search history.

(56) References Cited

U.S. PATENT DOCUMENTS

| 4,745,169 | A | 5/1988 | Sugiyama et al. |
| 5,264,319 | A | 11/1993 | Sugiyama et al. |
| 5,602,060 | A | 2/1997 | Kobayashi et al. |
| 6,043,147 | A | 3/2000 | Chen et al. |
| 6,127,258 | A | 10/2000 | Watanabe et al. |
| 6,232,235 | B1 | 5/2001 | Cave et al. |
| 6,395,649 | B1 | 5/2002 | Wu |
| 6,566,264 | B1* | 5/2003 | Cave et al. ............... 438/689 |
| 6,677,679 | B1* | 1/2004 | You et al. ............... 257/758 |
| 6,734,562 | B1* | 5/2004 | Farrar ............... 257/759 |

FOREIGN PATENT DOCUMENTS

| JP | 60-080844 | 5/1985 |
| JP | 5-70119 | 3/1993 |
| JP | 5-105759 | 4/1993 |
| JP | 5-105766 | 4/1993 |
| JP | 5-117392 | 5/1993 |
| JP | 9-199595 | 7/1997 |
| JP | 11-233500 | 8/1999 |

* cited by examiner

OTHER PUBLICATIONS

Korean Office Action dated Jun. 29, 2006, issued in corresponding Korean Patent Application No. 10-2001-0012331.

*Primary Examiner*—Hung Vu
(74) *Attorney, Agent, or Firm*—Westerman, Hattori, Daniels & Adrian, LLP.

(57) ABSTRACT

A low dielectric film forming material contains siloxane resin and polycarbosilane dissolved in solvent. By using this solution, a low dielectric film is formed which contains siloxane resin and polycarbosilane bonded to the siloxane resin. Material of a low dielectric film is provided which is suitable for inter-level insulating film material. A semiconductor device is also provided which has a low dielectric constant film and high reliability.

3 Claims, 7 Drawing Sheets

LOW DIELECTRIC CONSTANT FILM MATERIAL, FILM AND SEMICONDUCTOR DEVICE USING SUCH MATERIAL

CROSS-REFERENCE TO RELATED APPLICATIONS

This is a Divisional application of application Ser. No. 10/448,092, filed May 30, 2003, now U.S. Pat. No. 6,958,525 which is a Divisional application of application Ser. No. 09/797,865, filed Mar. 5, 2001 (now U.S. Pat. No. 6,613,834), the entire disclosures of which are hereby incorporated by reference.

This application is based on Japanese Patent Applications 2000-92138 filed on Mar. 29, 2000, and 2001-2113 filed on Jan. 10, 2001, the entire contents of which are incorporated herein by reference.

BACKGROUND OF THE INVENTION a) Field of the Invention

The present invention relates to low dielectric constant film materials, and to low dielectric constant films and semiconductor devices using such materials.

b) Description of the Related Art

Higher integration and higher speed of semiconductor integrated circuits are desired. A signal transmission speed in a semiconductor integrated circuit is restricted by wiring resistance and parasitic capacitance between wiring lines. Wiring resistance and parasitic capacitance are increasing as the wiring width and pitch are becoming narrow because of higher integration of semiconductor integrated circuits. Although parasitic capacitance can be reduced by thinning wiring lines, wiring resistance increases and the reduced capacitance does not contribute to improving the signal transmission speed. In order to increase the signal transmission speed, it is effective to make an inter-level insulating film have a low dielectric constant.

Conventionally, an inter-level insulating film is made of non-organic material such as silicon dioxide ($SiO_2$), silicon nitride (SiN), silicon oxyfluoride (SiOF) and phosphosilicate glass (PSG), or organic polymer such as polyimide. A relative dielectric constant of a silicon dioxide film formed by chemical vapor deposition (CVD) is about 4. A relative dielectric constant of a SiOF film is about 3.3 to 3.5 which is lower than that of silicon dioxide. However, since SiOF has a high moisture absorption rate, a SiOF film is likely to absorb moisture and raise its relative dielectric constant.

As low dielectric constant materials, attention has been paid to siloxane resin having Si—H bonds, porous siloxane resin or the like.

As siloxane resin is washed with alkaline solution, SiOH having a high moisture absorption rate is produced because of hydrolysis. Therefore, siloxane resin washed with alkaline solution raises its relative dielectric constant. Apart from this, an organic polymer film has as low a glass transition temperature as about 200 to 350° C. and a high thermal expansion coefficient. Damages to wiring layers are therefore large.

SUMMARY OF THE INVENTION

It is an object of the present invention to provide materials of low dielectric constant films suitable for inter-level insulating materials.

It is another object of the invention to provide low dielectric constant films suitable for inter-level insulating films.

It is still another object of the invention to provide semiconductor devices having low dielectric constant films and high reliability.

According to one aspect of the present invention, there is provided a low dielectric constant film forming material containing siloxane resin and polycarbosilane dissolved together.

According another aspect of the invention, there is provided a low dielectric constant film made of siloxane resin and polycarbosilane bonded to the siloxane resin.

According to another aspect of the invention, there is provided a semiconductor device comprising a semiconductor substrate and a dielectric film disposed on the principal surface of the semiconductor substrate and made of low dielectric constant material containing siloxane resin and polycarbosilane bonded to the siloxane resin.

By adding polycarbosilane to siloxane resin, resistance against alkaline of a siloxane resin film can be improved.

According to another aspect of the present invention, there is provided a semiconductor device comprising: a semiconductor substrate; a first film formed on a surface of the semiconductor substrate and made of a first silica-containing porous material; and a second film directly formed on the first film and made of a second silica-containing porous material, the second silica-containing porous material having an etching rate different from an etching rate of the first silica-containing porous material under a same etching condition.

According to another aspect of the invention, there is provided a method of manufacturing a semiconductor device, comprising the steps of: forming a first film made of a first silica-containing porous material on a surface of a semiconductor substrate; forming a second film of a second silica-containing porous material directly on a surface of the first film, an etching rate of the second silica-containing porous material being faster than an etching rate of the first silica-containing porous material; forming a trench having a depth greater than a thickness of the second film and a via hole through the first film, the via hole being partially overlapped by the trench; and burying a conductive material in the via hole and trench.

By using silica-containing porous material as the material of the first and second films, a dielectric constant can be lowered. Since the etching rates of the first and second films are different, it is easy to selectively etch only one of the first.

As above, by adding polycarbosilane to siloxane resin, resistance against alkaline of a low dielectric constant film can be improved. Therefore, a dielectric constant of a low dielectric constant film can be maintained low even after a process using alkaline solution.

By stacking a film made of silica-containing porous material having a faster etching rate upon a film made of silica-containing porous material having a slower etching rate, etching the upper layer can be stopped with relatively good controllability when the lower film is exposed.

DETAILED DESCRIPTION OF THE PREFERRED EMBODIMENTS

Figure 1:
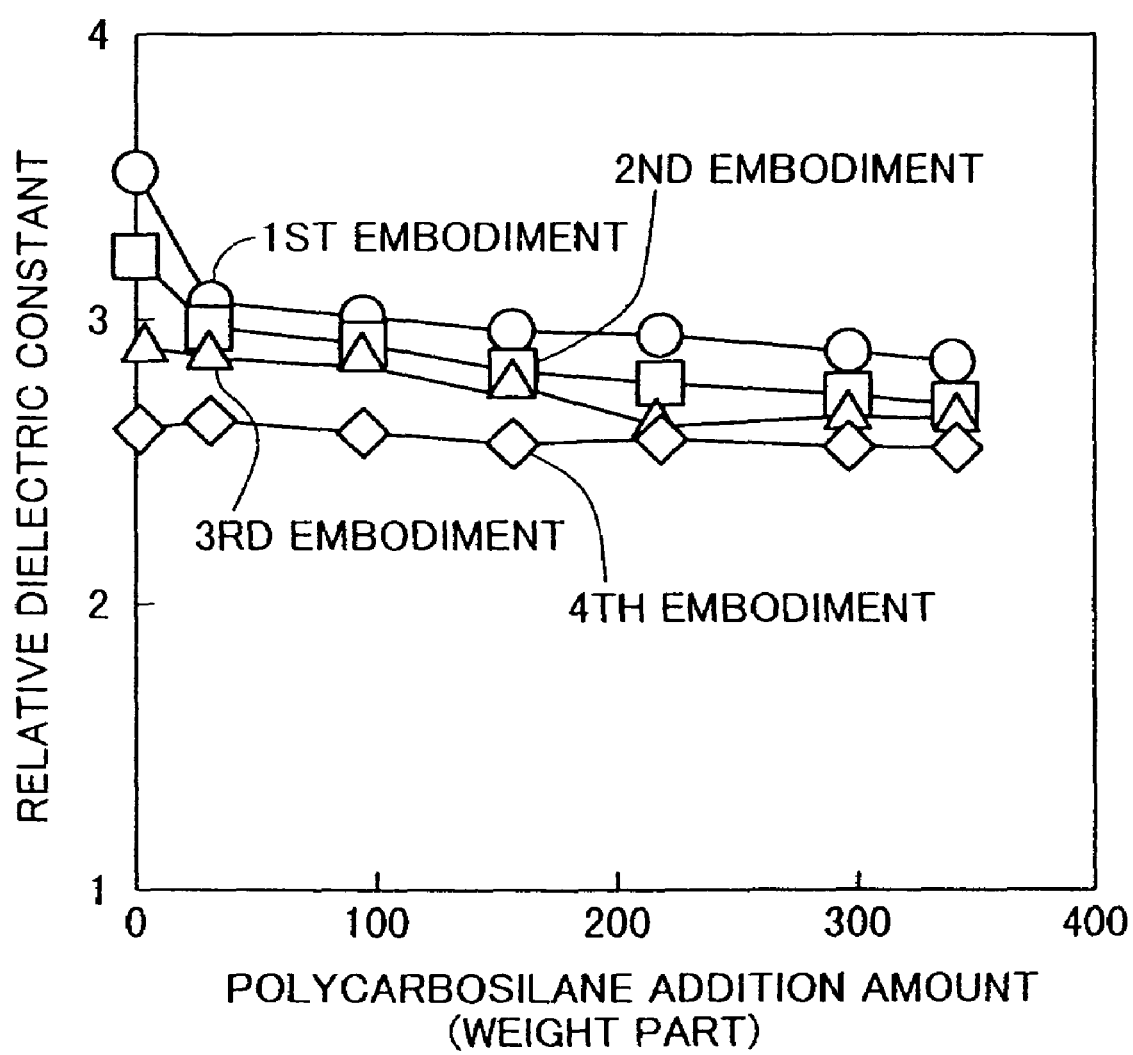
FIG. 1 is a graph showing a relation between polycarbosilane addition amounts and relative dielectric constants of films made of low dielectric constant film materials according to first to fourth embodiments.

Materials of a low dielectric constant film used in embodiments of the invention are obtained by dissolving siloxane resin and polycarbosilane region in solvent.

Siloxane resin may be those materials expressed by the following general chemical formula:

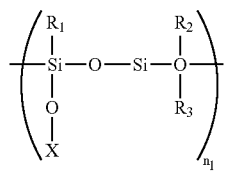

$R_1$ to $R_3$ represent hydrogen, oxygen or a monovalent hydrocarbon group such as a methyl group, an ethyl group and a phenyl group, and X represents hydrogen or Si. The number $n_1$ of monomer units is 5 to 200. If $R_1$ to $R_3$ are hydrogen, the group similar to X is bonded to these oxygen atoms. If X is Si, a main chain (—Si—O—) extends from this Si atom. The resin expressed by the general chemical formula may be: resin formed by a sol-gel process by using, as source material, tetraalkoxysilane, trialkoxysilane, methyltrialkoxysilane, or the like; resin formed by a sol-gel process by using a mixture of these source materials; resin formed by a sol-gel process by using, as source material, tetraalkoxysilane and dimethylalkoxysilane; and other resin.

Siloxane resin may also be those ladder type materials expressed, for example, by the following general chemical formula:

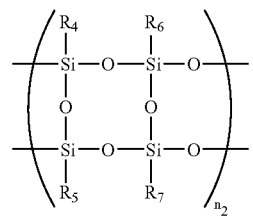

At least one of $R_4$ to $R_7$ represents hydrogen, and the others represent hydrogen, oxygen or a monovalent hydrocarbon group such as a methyl group, an ethyl group and a phenyl group. The number $n_2$ of monomer units is 5 to 100. The resin expressed by the general chemical formula may be hydrogen silsesquioxane, methyl silsesquioxane, fluorine-containing hydrogen silsesquioxane or the like.

Polycarbosilane may be those materials expressed by the following general chemical formula:

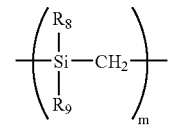

$R_8$ and $R_9$ represent hydrogen or a monovalent hydrocarbon group such as a methyl group, an ethyl group and a phenyl group, and X represents hydrogen or Si. The number m of monomer units is 20 to 1,000.

Usable solvent is not particularly limited if it can dissolve siloxane resin and polycarbosilane. For example, usable solvent may be cyclohexanone, methyl isobutyl ketone, methyl ethyl ketone, methyl cellosolve, ethyl cellosolve, octane, decane, propylene glycol, propylene glycol monoethylether, propylene glycol monoethylether acetate, or the like.

In order to make a porous low dielectric constant film, organic compound (desorption agent) which can be desorbed by heat or light may be added to solvent. Such organic compound may be adamantane compound such as adamantane monophenol, or the like. A porous low dielectric constant film has a dielectric constant lower than if it is not made porous. If desorption agent is added too much, the mechanical strength of the film is lowered. It is therefore preferable to set the addition amount of desorption agent to 70 weight % or less relative to a mixture of siloxane resin and polycarbosilane.

The inventors have found that siloxane resin added with polycarbosilane is given a nature of repelling alkaline solution. A low dielectric constant film made of the above-described material is easy to repel alkaline solution. Therefore, even if a semiconductor substrate with a low dielectric constant film made of such material is worked in alkaline solution, hydrolysis of the film by alkaline solution can be suppressed and an increase in the dielectric constant can be suppressed.

Since polycarbosilane has a high compatibility with siloxane resin, it can be dispersed uniformly in siloxane resin.

Polycarbosilane has a high moisture resistance. By adding polycarbosilane to porous siloxane resin which is inferior, particularly to moisture resistance, the moisture resistance of siloxane resin can be improved considerably.

If an average molecular weight of polycarbosilane is too small, most of polycarbosilane is evaporated by heat during the film formation. If the average molecular weight is too large, solubility of polycarbosilane relative to solvent lowers so that it is difficult to produce coating solution. It is therefore preferable to set an average molecular weight of polycarbosilane to a value of 1,000 or larger and 500,000 or smaller.

If siloxane resin contains a silanol group having a high moisture absorption rate, the side chain of polycarbosilane is preferably hydrogen, because silanol groups reduce by reaction between a silanol group and hydrogen.

If the addition amount of polycarbosilane is too small, sufficient alkaline resistance and moisture resistance cannot be obtained. If the addition amount is too large, an adhesion degree of a film lowers. It is therefore preferable to set the addition amount of polycarbosilane to 10 to 300 weight parts relative to siloxane resin of 100 weight parts.

Low dielectric constant film material described above is spin-coated on the surface of a semiconductor substrate, solvent is evaporated at 120 to 250° C., and heat treatment at 300° C. or higher is performed for cross-linking. In this manner, a low dielectric constant film with polycarbosilane being cross-linked with siloxane resin can be obtained.

Next, a specific method of producing low dielectric constant film material according to the first embodiment will be described.

Tetraethoxysilane of 20.8 g (0.1 mol) and methyltriethoxysilane of 17.8 g (0.1 mol) are dissolved in methylisobutylketone of 39.6 g. Nitric acid solution of 16.2 g (0.9 mol) at a concentration of 400 ppm is dripped in ten minutes and thereafter an aging process is performed for two hours. Tetraethoxysilane and methyltriethoxysilane are therefore copolymerized to produce siloxane resin.

Next, magnesium nitrate of 5 g is added to remove excessive water contents. Ethanol produced by the aging process is removed until the reaction solution reduces to 50 ml, by using a rotary evaporator. Methyl isobutyl ketone of 20 ml is added to the obtained reaction solution to produce siloxane resin solution.

Polycarbosilane of an average molecular weight of 20,000 is added to the siloxane resin solution by an amount of 10 to 300 weight parts relative to the siloxane resin (solid composition) of 100 weight parts. With these processes, resin solution to be used for forming a low dielectric constant film can be produced. Polycarbosilane has the main chain of (—SiH(CH$_3$)—CH$_2$—).

For the comparison sake, resin solution without polycarbosilane and resin solution with polycarbosilane at addition amounts of 5 and 350 weight parts were formed.

Next, a method of producing low dielectric constant film material according to the second embodiment will be described.

In the first embodiment, tetraethoxysilane of 20.8 g and methyltriethoxysilane of 17.8 g are used as the source material of siloxane resin. In the second embodiment, tetraethoxysilane of 20.8 g (0.1 mol) and triethoxysilane of 16.4 g (0.1 mol) are used. The production processes are similar to the first embodiment. Isobutyl ketone of 37.2 g is used.

Next, a method of producing low dielectric constant film material according to the third embodiment will be described. Sulfuric acid of 88 g (0.9 mol) and fuming sulfuric acid of 33 g (60% SO$_4$) are introduced into a reaction chamber having a nitrogen gas inlet pipe and a quantitative liquid pump. Fuming sulfuric acid is introduced in order to dehydrate the inside of the reaction chamber. Toluene of 87 g (0.95 mol) is dripped from the quantitative pump at 2 ml/min and thereafter, an aging process is performed for one hour. With this aging process, toluenesulfonic hydrate is produced.

Solution of trichlorosilane of 41 g (0.3 mol) at a concentration of 20 weight % dissolved in toluene is dripped from the quantitative pump at 2 ml/min. After dripping, an aging process is performed for two hours. With this aging, ladder type siloxane resin is synthesized. After these processes, fluoric acid solution of 100 ml at a concentration of 50 weight % is added to then remove precipitated toluenesulfonic acid. Excessive fluoric acid solution is removed by using a separatory funnel.

The remaining fluoric acid is neutralized with calcium carbonate of 2 g. After dehydration by magnesium nitrate of 5 g, toluene is removed by using a rotary evaporator. With these processes, a solid material of hydrogen silsesquioxane resin of 15 g is produced. This hydrogen silsesquioxane is dissolved in methylisobutyl ketone of 70 g to obtain solution having a solid material concentration of 17.5 weight %.

Polycarbosilane of an average molecular weight of 20,000 is added to the obtained solution by an amount of 20 to 300 weight parts relative to the solid material in the solution of 100 weight parts.

Next, a method of producing low dielectric constant film material according to the fourth embodiment will be described. In the third embodiment, trichlorosilane of 41 g is used as the source material of hydrogen silsesquioxane. In the fourth embodiment, trichlorosilane 36 g (0.27 mol) and fluorotrichlorosilane of 4.6 g (0.03 mol) are used. The production processes are similar to the third embodiment.

In the fourth embodiment, resin solution of fluoride-containing hydrogen silsesquioxane of 15 g and polycarbosilane is produced.

Next, a method of forming a low dielectric constant film by using low dielectric constant film material (resin solution) according to any one of the first to fourth embodiments will be described.

Resin solution of one of the first to fourth embodiments is spin-coated on a silicon wafer surface at 3,000 rpm in 20 seconds. After the spin-coating, solvent is evaporated at 200° C. In a nitrogen atmosphere which contains oxygen at a concentration of 100 ppm or lower, a heat treatment is performed at 400° C. for 30 minutes. With this heat treatment, siloxane resin and polycarbosilane are cross-linked and a low dielectric constant film is formed.

FIG. 1 is a graph showing a relation between relative dielectric constants of low dielectric constant films and addition amounts of polycarbosilane. The abscissa represents the addition amount of polycarbosilane relative to siloxane resin of 100 weight parts, in the unit of "weight part", and the ordinate represents the relative dielectric constant of a low dielectric constant film. In FIG. 1, white circle, white square, white triangle and white rhomboid symbols indicate the relative dielectric constants of low dielectric constant films respectively made of the film forming materials of the first to fourth embodiments. For the reference sake, the relative dielectric constants of comparison examples without polycarbosilane and with polycarbosilane at an addition amount of 350 weight parts are shown by using identical symbols to those of corresponding embodiments.

Each of the embodiments shows a relative dielectric constant of about 2.5 to 3 which are lower than that of an insulating film made of silicon dioxide. Particularly in the first and second embodiments, the relative dielectric constant is made low by adding polycarbosilane.

Figure 2:
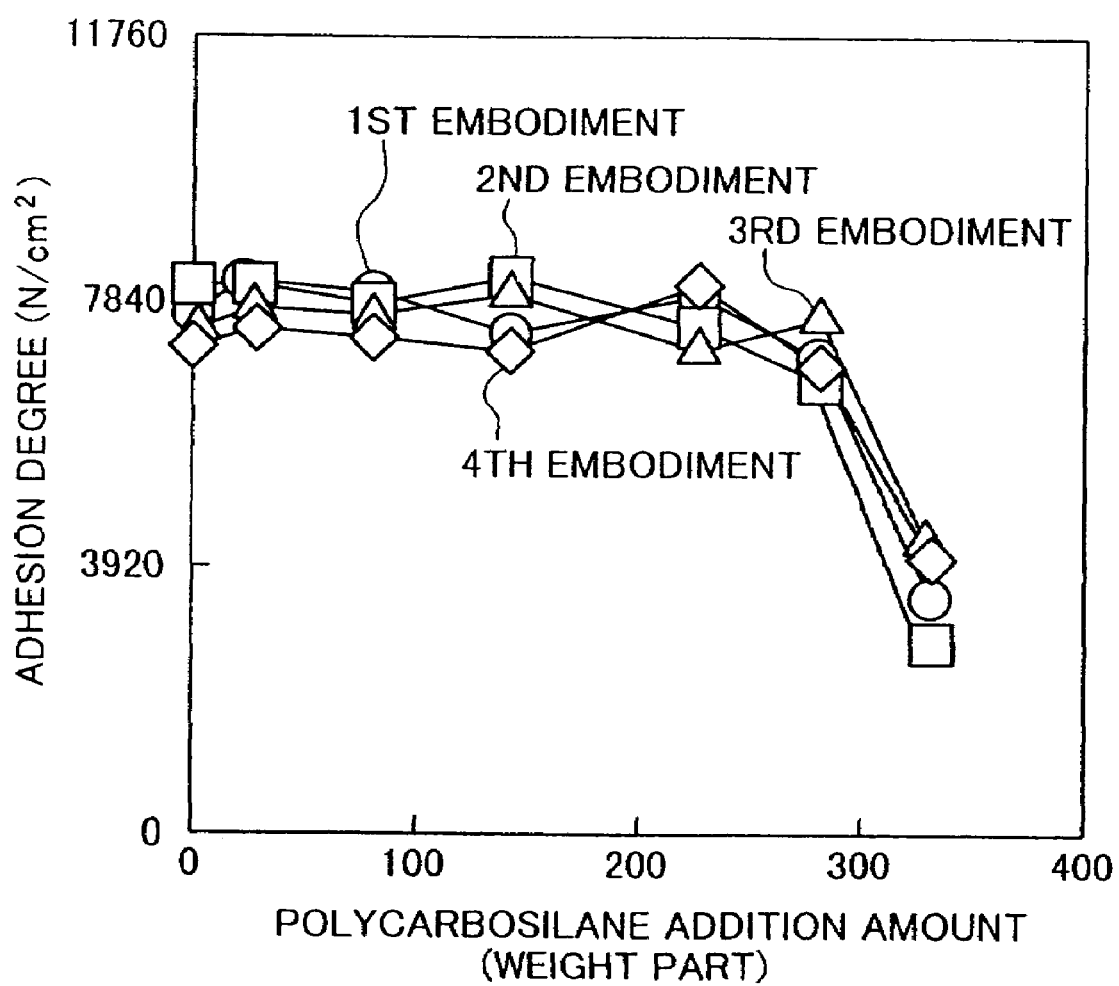
FIG. 2 is a graph showing a relation between polycarbosilane addition amounts and adhesion degrees of films made of low dielectric constant film materials according to the first to fourth embodiments.

FIG. 2 shows a relation between the adhesion degree of a low dielectric constant film and the addition amount of polycarbosilane. The adhesion degree was measured with a Sebastian meter by attaching a stud pin having a diameter of 2 mm to the film surface with epoxy resin. The abscissa of FIG. 2 represents the addition amount of polycarbosilane in the unit of "weight part", and the ordinate represents a tensile strength per unit area when peel-off occurs, in the unit of "N/cm$^2$". The meaning of each symbol in FIG. 2 is similar to that used in FIG. 1.

The adhesion degrees of comparison examples with polycarbosilane added by 350 weight parts are lower than those of the embodiments with polycarbosilane added by 300 weight parts or less. It is therefore preferable to set the addition amount of polycarbosilane to 300 weight parts or less relative to siloxane resin of 100 weight parts.

Next, an alkaline resistance of a low dielectric constant film will be described. The surface state of a low dielectric constant film was observed after it is immersed for one minute in tetramethylammonium hydride solution at a concentration of 2.38%. Cracks formed in the films were observed in comparison examples without polycarbosilane and comparison examples with polycarbosilane of five weight parts. No crack was observed in the films of the first to fourth embodiments with polycarbosilane at 10 to 300 weight parts. It is therefore preferable to set the addition amount of polycarbosilane to 10 weight parts relative to siloxane resin of 100 weight parts, in order to retain a high alkaline resistance.

Next, methods of producing low dielectric constant film materials according to the fifth to eighth embodiments will be described. The low dielectric constant film materials of the fifth to eighth embodiments are produced by adding adamantane monophenol to the siloxane resin added with polycarbosilane of the first to fourth embodiment. The addition amount of polycarbosilane is 150 weight parts relative to siloxane of 100 weight parts. The addition amount of adamantane monophenol is 0 to 70 weight % relative to a mixture of siloxane resin and polycarbosilane. For the comparison sake, resin solution was produced which had 80 weight % of the addition amount of adamantane monophenol relative to the mixture of siloxane resin and polycarbosilane.

Resin solution of the fifth to eighth embodiments and comparison examples was spin-coated to a silicon wafer surface to form low dielectric constant films. Adamantane phenol is desorbed during a heat treatment for cross-linking to thereby obtain a porous film.

Figure 3:
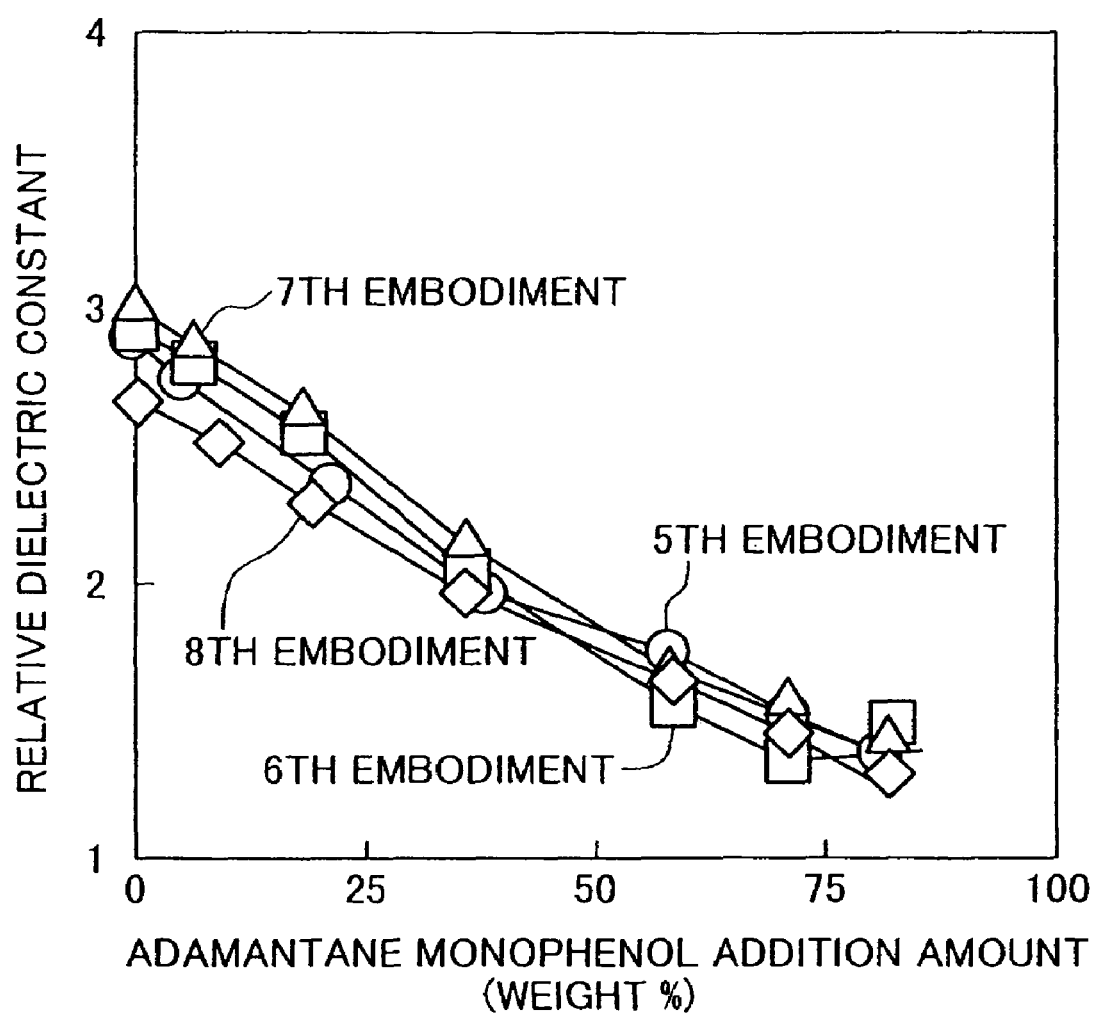
FIG. 3 is a graph showing a relation between polycarbosilane addition amounts and relative dielectric constants of films made of low dielectric constant film materials according to fifth to eighth embodiments.

FIG. 3 is a graph showing a relation between relative dielectric constants of porous low dielectric constant films and addition amounts of adamantane. The abscissa represents the addition amount of adamantane in the unit of "weight %", and the ordinate represents the relative dielectric constant. In FIG. 3, white circle, white square, white triangle and white rhomboid symbols indicate the relative dielectric constants of low dielectric constant films respectively made of the film forming materials of the fifth to eighth embodiments. As apparent from the comparison between FIGS. 1 and 3, by making the film porous, the relative dielectric constant of the film can be made smaller.

Figure 4:
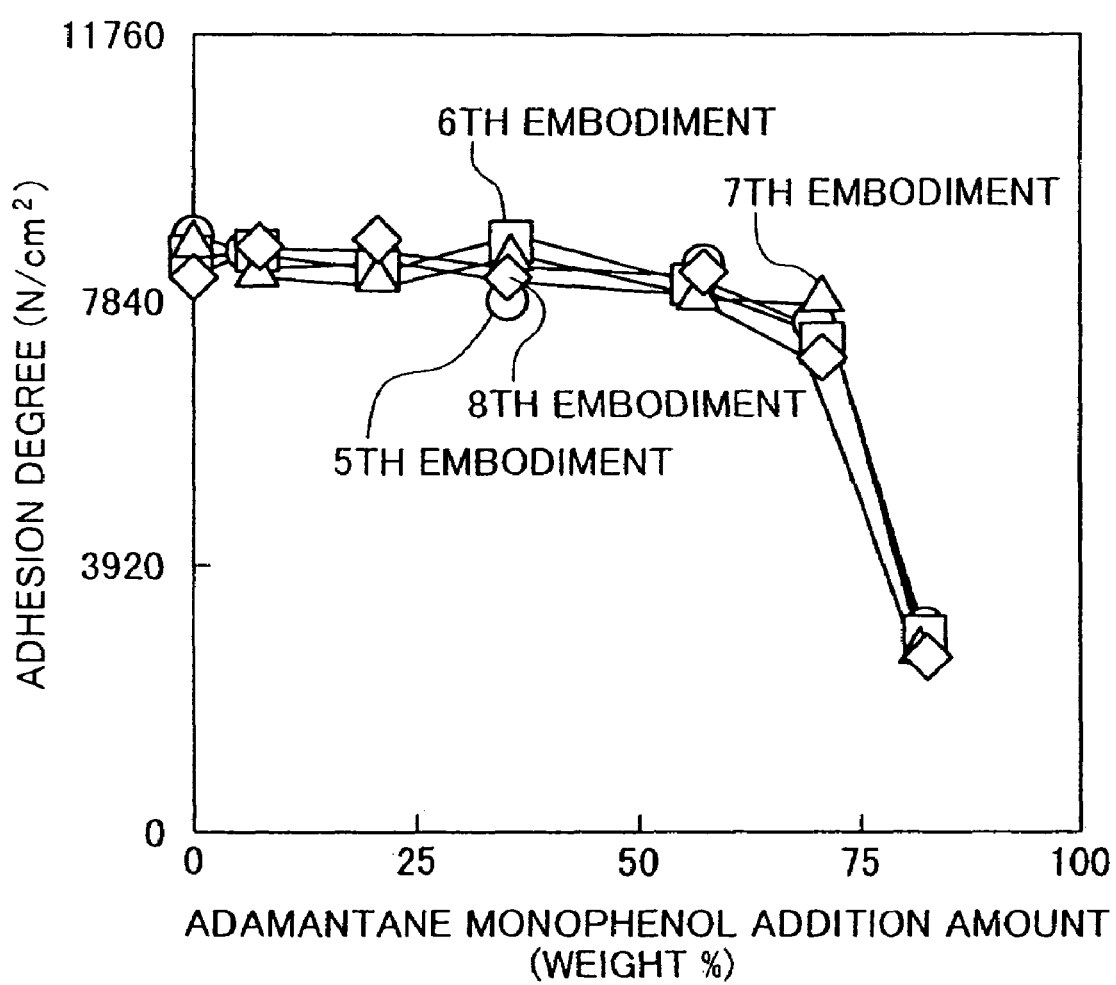
FIG. 4 is a graph showing a relation between polycarbosilane addition amounts and adhesion degrees of films made of low dielectric constant film materials according to the fifth to eighth embodiments.

FIG. 4 shows a relation between the adhesion degree of a porous low dielectric constant film and the addition amount of adamantane monophenol. The abscissa of FIG. 4 represents the addition amount of adamantane monophenol in the unit of weight % relative to the mixture of siloxane resin and polycarbosilane, and the ordinate represents the adhesion degree in the unit of "N/cm$^2$". The adhesion degree was measured by a method similar to that described with FIG. 2.

As the addition amount of adamantane monophenol is increased from 70 weight % to 80 weight %, the adhesion degree of the film lowers rapidly. It is therefore preferable to set the addition amount of adamantane monophenol to 70 weight % or less.

Next, a method of inspecting whether siloxane resin contains polycarbosilane will be described. Polycarbosilane has a main chain of (—Si—CH$_2$—Si—), whereas siloxane resin has a main chain of (—Si—O—Si—).

The bond (—Si—CH$_2$—Si—) can be confirmed from a peak of infrared spectra at 1080 to 1040 cm$^{-1}$. Although this peak partially overlaps a peak corresponding to the bond (—Si—O—Si—), these peaks are sharp so that they can be distinguished from each other. Whether a low dielectric constant film formed on a semiconductor substrate contains polycarbosilane can be judged from microscope infrared spectral analysis.

Next, the structure of a semiconductor device and its manufacture method according to the embodiment will be described, the semiconductor device using film forming materials of any of the first to eighth embodiments.

Figure 5:
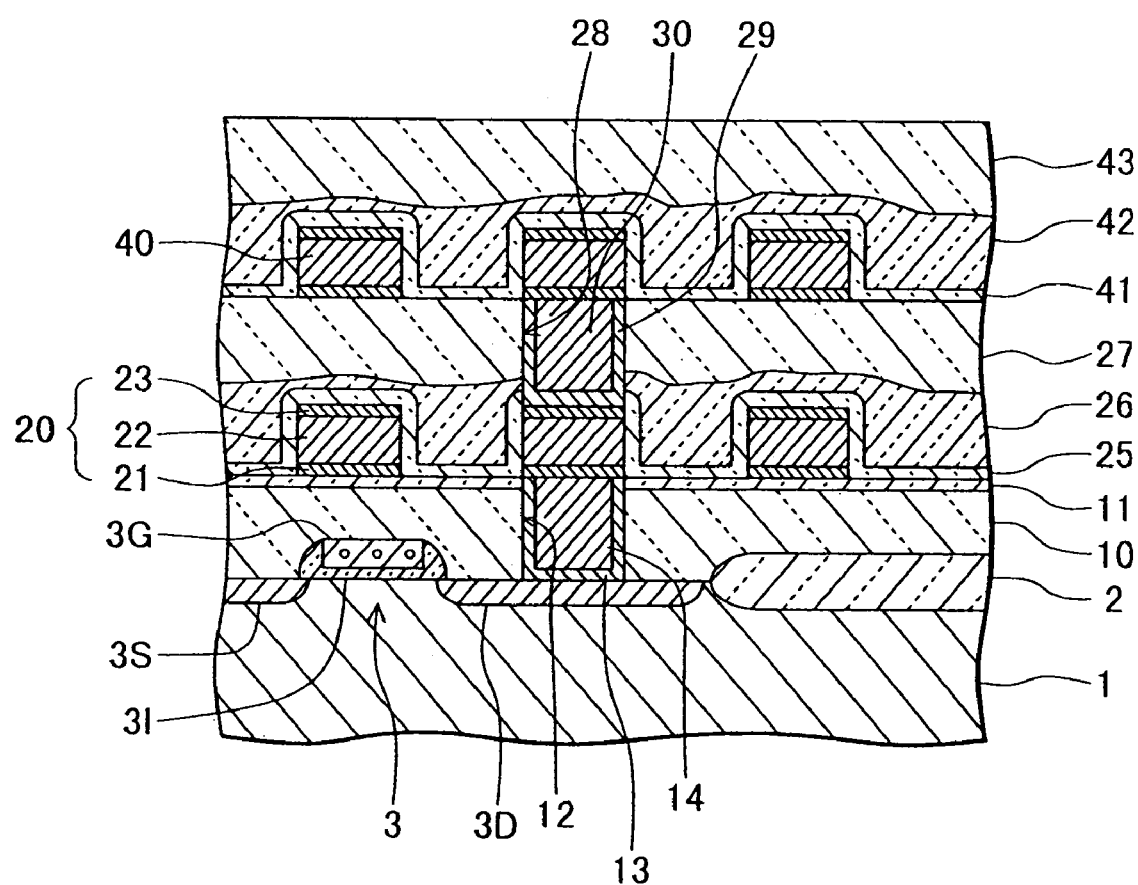
FIG. 5 is a cross sectional view of a semiconductor device using low dielectric constant films which are made of materials of any of the first to eighth embodiments.

FIG. 5 is a cross sectional view of a semiconductor device having aluminum (Al) wiring layers. A field oxide film 2 formed on the surface of a silicon substrate 1 defines an active region. A MOSFET 3 is formed in the active region. MOSFET 3 has a source region 3S, a drain region 3D, a gate electrode 3G and a gate oxide film 3I.

An inter-level insulating film 10 of SiO$_2$ and a stopper film 11 of SiN are formed on the substrate, covering MOSFET 3. A contact hole 12 is formed through the inter-level insulating film 10 in the area corresponding to the drain region 3D. The side wall and bottom surface of the contact hole 12 are covered with a barrier layer 13 of TiN. The inside of the contact hole 12 is fully buried with a plug 14 of tungsten (W).

The barrier layer 13 and plug 14 are formed by depositing a TiN layer and a W layer over the whole substrate surface and by performing chemical mechanical polishing. Deposition of the TiN layer is performed by sputtering. Deposition of the W layer is performed by chemical vapor deposition (CVD) using tungsten hexafluoride and hydrogen.

First-layer wiring lines 20 are formed on the surface of the stopper film 11. The first-layer wiring line 20 has a three-layer structure of a 50 nm thick TiN film 21, a 450 nm thick Cu-containing Al film 22 and a 50 nm thick TiN film stacked in this order. Patterning the TiN film and Al film is performed by plasma etching using hydrochloric acid gas. One first-layer wiring line 20 is electrically connected to the W plug 14.

The surfaces of the first-layer wiring lines 20 and stopper film 11 are covered with a liner film of SiO$_2$ having a thickness of 50 nm. The liner film 25 is formed by CVD using tetraethylorthosilicate (TESO) and oxygen.

A low dielectric constant film 26 is formed on the liner film 25. The low dielectric constant film 26 is formed by spin-coating siloxane resin solution of one of the first to eighth embodiments. The low dielectric constant film 26 is formed under the condition that it has a thickness of 500 nm on the flat surface of the silicon substrate.

On the low constant dielectric film 26, a cap layer 27 of SiO$_2$ having a thickness of 1000 nm is formed. The cap layer 27 is formed by CVD using TEOS and oxygen. The upper surface of the cap layer 27 is planarized by CMP. CMP is performed until the total thickness of the liner film 25, low dielectric constant film 26 and cap layer 27 becomes 1200 nm on the area where the first-layer wiring line 20 is not disposed.

A via hole 28 is formed through the three layers including the liner film 25, low dielectric constant film 26 and cap layer 27. This via hole 28 is formed by plasma etching using $CF_4$ and $CHF_3$. The side wall and bottom surface of the via hole 28 are covered with a barrier layer 29. The inside of the via hole 20 is fully buried with a W plug 30. The barrier layer 29 and W plug 30 are formed by a method similar to that used for the lower barrier layer 13 and plug 14.

On the cap layer 27, second-layer wiring lines 40 are formed. A second layer liner film 41, a low dielectric constant film 42 and a cap layer 43 are laminated covering the second-layer wiring lines 40. These liner film 41, low dielectric constant film 42 and cap layer 43 are formed by a method similar to that used for the first-layer corresponding films and layer.

In the multi-layer wiring structure shown in FIG. 5, the space between adjacent wiring lines in the same layer is filled with the low dielectric constant film. Since the low dielectric constant films 26 and 42 are made of the material described in the above embodiments, a moisture absorption rate does not increase even if a process using alkaline solution is performed, and a low dielectric constant is maintained.

Figure 6:
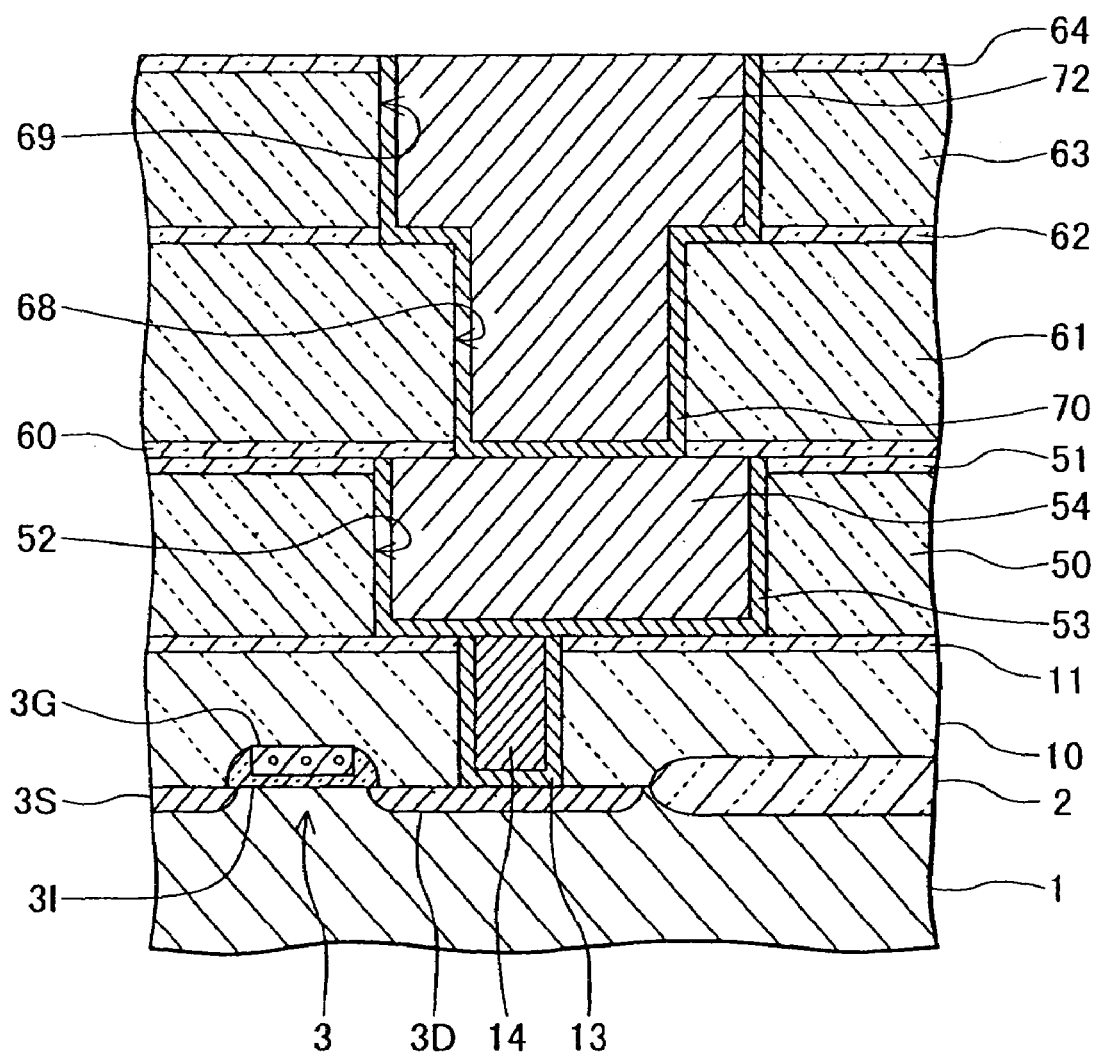
FIG. 6 is a cross sectional view of a semiconductor device using low dielectric constant films according to a ninth embodiment of the invention.

FIG. 6 is a cross sectional view of a semiconductor device having copper (Cu) wiring lines according to the ninth embodiment of the invention. The structure from a silicon substrate 1 to a stopper film 11 is the same as that of the corresponding components of the semiconductor device shown in FIG. 5. In FIG. 6, constituent elements are represented by identical reference numerals to those corresponding elements shown in FIG. 5.

On the stopper film 11, a low dielectric constant film 50 is formed. The low dielectric constant film 50 is formed by using the material of the above-described embodiment under the condition that it has a thickness of 450 nm on the flat surface of the silicon substrate. On this low dielectric constant film 50, a cap layer 51 of $SiO_2$ having a thickness of 50 nm is formed. The cap layer 51 is formed by CVD using TEOS and oxygen.

A first-layer wiring trench 52 is formed through the low dielectric constant film 50 and cap layer 51. The first-layer wiring trench 52 is formed by plasma etching using $CF_4$ and $CHF_3$. The upper surface of the plug 14 is exposed on the bottom surface of the first-layer wiring trench 52.

The side wall and bottom surface of the first-layer wiring trench 52 are covered with a barrier layer 53 of TaN having a thickness of 50 nm. The inside of the wiring trench 52 is fully buried with the first-layer wiring line 54 of Cu. In the following, a method of forming the barrier layer 53 and first-layer wiring line 54 will be described.

A TaN film is formed through sputtering on the whole surface of the substrate including the inner surface of the first-layer wiring trench 52. A Cu film having a thickness of 50 nm is formed through sputtering on the TaN film. By using this Cu film as an electrode, a Cu film having a thickness of 600 nm is formed by electroplating. Unnecessary Cu and TaN films are removed by CMP to leave the barrier layer 53 and first-layer wiring line 54 in the first-layer wiring trench 52.

On the cap layer 51, a lamination structure is formed having a 50 nm thick SiN diffusion preventing film 60, a low dielectric constant film 61, a 50 nm thick SiN stopper film 62, a low dielectric constant film 63, and a 50 nm SiN cap layer 64. The diffusion preventing film 60 and stopper film 62 are formed by plasma CVD using silane and ammonium gas. The low dielectric constant films 61 and 63 are formed under the condition that they have thicknesses of 650 nm and 400 nm respectively, on the flat surface of the silicon substrate.

A via hole 68 is being formed through the diffusion preventing film 60 and low dielectric constant film 61. A second-layer wiring trench 69 is being formed through the stopper film 62, low dielectric constant film 63 and cap layer 64. The inner surfaces of the via hole 68 and second-layer wiring trench 69 are covered with a barrier layer 70 of TaN having a thickness of 50 nm. The second-layer wiring line 72 of Cu fully buries the inside of the via hole 68 and second-layer wiring trench 69. The second-layer wiring line 72 is formed by a dual-damascene method.

The dual-damascene method will be briefly described. First, the via hole 68 is formed extending from the upper surface of the cap layer 64 to the upper surface of the first-layer wiring line 54. Next, the second-layer wiring trench 69 is formed extending from the upper surface of the cap layer 64 to the upper surface of the low dielectric constant film 61. The barrier layer 70 and second-layer wiring line 72 are formed by a method similar to that used for the lower barrier layer 53 and first-layer wiring line 54.

The first-layer wiring line 54 and second-layer wiring line 72 are surrounded by the low dielectric constant films 50, 61 and 63 so that parasitic capacitance between wiring lines can be reduced. Since these low dielectric constant films 50, 61 and 63 are made of the material of the above-described embodiment, the moisture absorption rate does not increase and the dielectric constant can be maintained low, even if a process using alkaline solution is performed.

Figure 7:
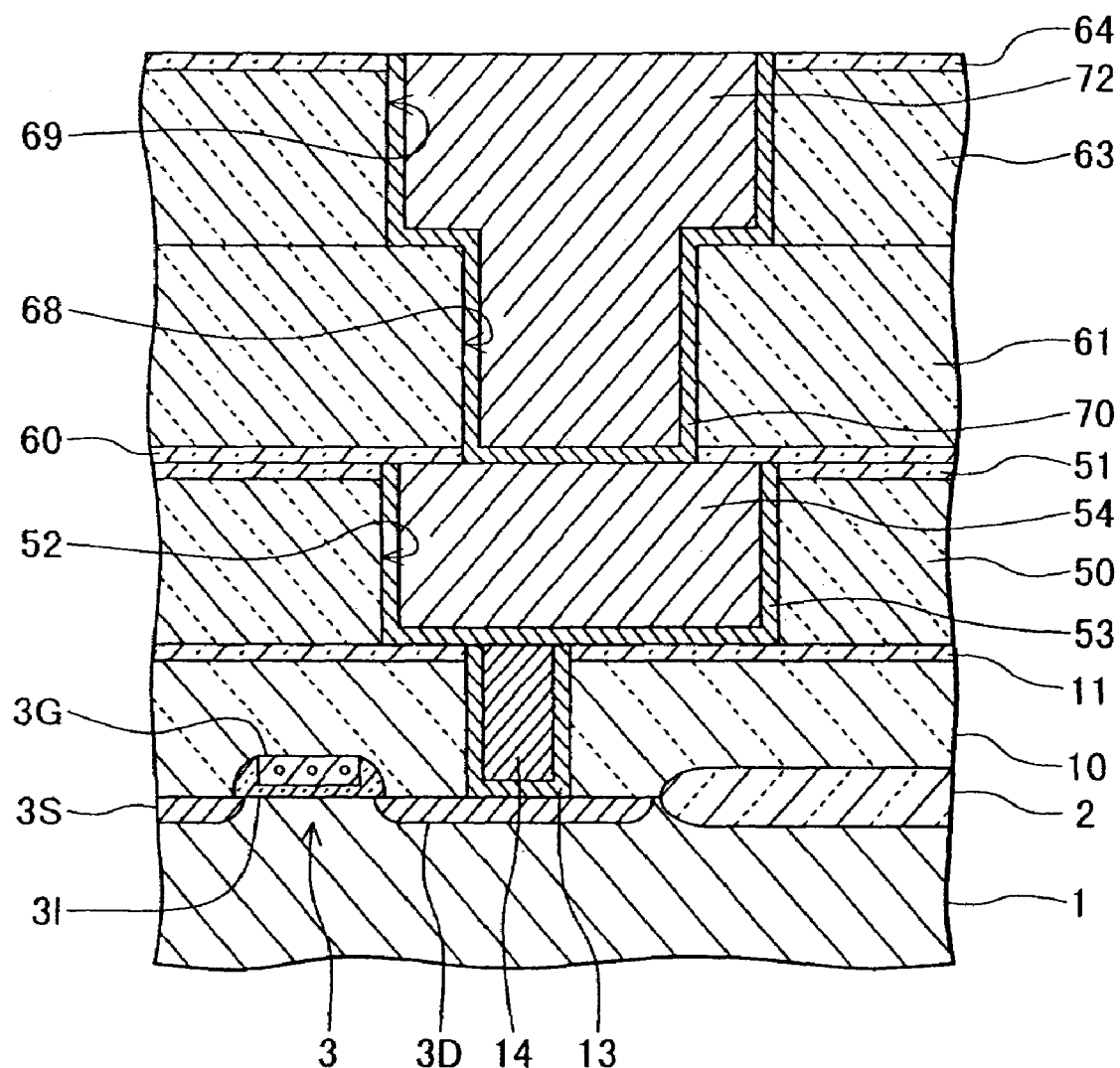
FIG. 7 is a cross sectional view of a semiconductor device using low dielectric constant films according to a tenth embodiment of the invention.

Next, with reference to FIG. 7, a semiconductor device and its manufacture method according to the tenth embodiment will be described. In the semiconductor device of the ninth embodiment shown in FIG. 6, the stopper film 62 of silicon nitride is disposed between the low dielectric constant film 61 and its upper low dielectric constant film 63. In the tenth embodiment, the stopper film 62 is not used but the low dielectric constant film 63 directly contacts the low dielectric constant film 61.

In the tenth embodiment, the low dielectric constant films 61 and 63 are made of silica-containing porous material. Under the same etching condition, an etching rate of the upper low dielectric constant film 63 is faster than that of the lower low dielectric constant film 61. The other structures are similar to those of the ninth embodiment shown in FIG. 6.

The low dielectric constant films 61 and 63 contain siloxane resin expressed, for example, by the following general chemical formula:

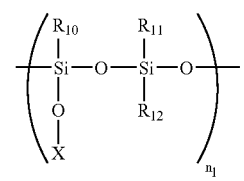

or ladder type siloxane resin expressed by the following general chemical formula:

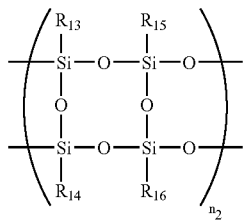

$R_{10}$ to $R_{12}$ represent hydrogen, oxygen or a monovalent hydrocarbon group, and $R_{13}$ to $R_{16}$ represent hydrogen; fluorine or a monovalent hydrocarbon group. $n_1$ is an integer of 5 to 200, and X represents hydrogen or silicon. $n_2$ is an integer of 5 to 100.

For the lower low dielectric constant film 61, at least one of $R_{10}$ to $R_{12}$ or at least one of $R_{13}$ to $R_{16}$ is a phenyl group or a hydrocarbon group having 2 to 5 carbon atoms. For the upper dielectric constant film 63, none of $R_{10}$ to $R_{12}$ are a hydrocarbon group having two or more carbon atoms or none of $R_{13}$ to $R_{16}$ are a hydrocarbon group having two or more carbon atoms.

The present inventors have found that an etching rate can be changed by changing side chains of siloxane resin or ladder type siloxane resin. Specifically, if the material has only hydrogen or a methyl group as side chains, the etching rate of the material by fluoric plasma becomes three times or more faster than such a material as at least one side chain in one monomer unit is a phenyl group or a hydrocarbon group having two or more carbon atoms. In the tenth embodiment, the materials of the films 61 and 63 are selected so that the etching rate of the upper low dielectric constant film 63 becomes three times or more faster than that of the upper low dielectric constant film 61.

Next, an example of a method of producing the material of the lower low dielectric constant film 61 will be described. Tetraethoxysilane of 20.8 g (0.1 mol) and phenyltriethoxysilane of 20.4 g (0.1 mol) are dissolved in methylisobutylketone of 37.2 g to obtain solution of 200 ml. Nitric acid solution of 16.2 g (0.9 mol) at a concentration of 400 ppm is dripped in ten minutes into the obtained solution and thereafter an aging process is performed for two hours. Tetraethoxysilane and phenyltriethoxysilane are therefore copolymerized to produce siloxane resin. This siloxane resin has the composition that at least one of $R_{10}$ to $R_{12}$ in the above-described general chemical formula is a phenyl group and the others are oxygen atoms. Each oxygen atom is also bonded to a hydrogen atom or a silicon atom.

Next, magnesium nitrate of 5 g is added to the siloxane resin solution to remove excessive water contents. Solvent containing ethanol is removed until the reaction solution reduces to 50 ml, by using a rotary evaporator. Adamantane monophenol of 0.1 g is added to the produced reaction solution. In this manner, siloxane resin solution for forming the lower low dielectric constant film 61 is produced. Adamantane monophenol is desorption agent for making the low dielectric constant film porous.

Next, an example of a method of producing the material of the upper low dielectric constant film 63 will be described. Tetraethoxysilane of 20.8 g (0.1 mol) and methyltriethoxysilane of 17.8 g (0.1 mol) are dissolved in methylisobutylketone of 39.6 g to obtain solution of 200 ml. Nitric acid solution of 16.2 g (0.9 mol) at a concentration of 400 ppm is dripped in ten minutes into the obtained solution and thereafter an aging process is performed for two hours. Tetraethoxysilane and methyltriethoxysilane are therefore copolymerized to produce siloxane resin. This siloxane resin has the composition that at least one of $R_{10}$ to $R_{12}$ in the above-described general chemical formula is a methyl group and the others are oxygen atoms. Each oxygen atom is also bonded to a hydrogen atom or a silicon atom.

Next, similar to the synthesis of the lower low dielectric constant film material, excessive water contents are removed and solvent containing ethanol which is a byproduct of the aging process is removed until the reaction solution reduces to 50 ml. Adamantane monophenol of 0.1 g is added to the produced reaction solution. In this manner, siloxane resin solution for forming the upper low dielectric constant film 63 is produced.

Next, a method of manufacturing the semiconductor device shown in FIG. 7 by using the above-described low dielectric constant film materials will be described.

The processes up to forming the diffusion preventing film 60 are similar to the manufacture method of the semiconductor device of the ninth embodiment shown in FIG. 6, and so the description thereof is omitted. On the diffusion preventing film 60, siloxane resin solution as the lower low dielectric film material is spin-coated. Solvent is dried off at a temperature of 200° C. An annealing process is performed for 30 minutes at a temperature of 400° C. in a nitrogen atmosphere having an oxygen concentration of 100 ppm or lower. The lower low dielectric constant film 61 made of silica-containing porous material and having a thickness of 500 nm is therefore formed.

On the lower low dielectric constant film 61, siloxane resin solution as the upper low dielectric film material is spin-coated. Solvent is dried off and an annealing process is performed to obtain the upper low dielectric constant film 63 having a thickness of 400 nm. The conditions for solvent drying and annealing are the same as those used for forming the lower low dielectric constant film 61.

On the low dielectric constant film 63, the cap layer 64 of silicon oxide having a thickness of 50 nm is formed by chemical vapor deposition (CVD) using tetraethylorthosilicate (TEOS).

On the surface of the cap layer 64, a resist pattern having an opening corresponding to the via hole 68 is formed. A hole extending from the upper surface of the cap layer 64 to the upper surface of the first-layer wiring line 54 is formed by using fluoric plasma using $CF_4$ and $CHF_3$ as source materials. After the resist pattern is removed, a resist pattern having an opening corresponding to the second-layer wiring trench 69 is newly formed on the surface of the cap layer 64.

By using fluoric plasma using $C_2F_6$ and $O_2$ as source materials, the upper low dielectric constant film 63 is etched to form the second-layer wiring trench 69. This etching is performed under the conditions of a $C_2F_6$ flow rate of 40 sccm, an $O_2$ flow rate of 10 sccm, an input power of 200 W for generating inductive coupling plasma, and a gas pressure of 5.32 Pa (40 mTorr). Under these etching conditions, the etching rate of the upper low dielectric constant film 63 is about 100 nm/min, whereas the etching rate of the lower low dielectric constant film 61 is about 30 nm/min. Since the etching rate of the lower low dielectric constant film 61 is slower than the etching rate of the upper low dielectric constant film 63, the etching can be stopped with good controllability when the upper surface of the lower low dielectric constant film 61 is exposed, even if an etching stopper layer is not provided. In order to stop the etching with good controllability, it is preferable that under the same etching conditions, the etching rate of the upper low dielectric constant film 63 is two times or more faster than the etching rate of the lower low dielectric constant film 61.

After the resist pattern is removed, the barrier layer 70 and second-layer wiring line 72 are formed. The barrier layer 70 and second-layer wiring line 72 are formed by a method similar to the first embodiment shown in FIG. 6.

In the tenth embodiment, a silicon nitride film having a relatively high dielectric constant is not disposed between the lower and upper low dielectric constant films 61 and 63. Therefore, a parasitic capacitance between wiring lines can be reduced further. An electrostatic capacitance between two second-layer wiring lines 72 disposed in parallel was measured to calculate an effective relative dielectric constant which was about 2.5. In contrast, an effective relative dielectric constant of the ninth embodiment shown in FIG. 6 was 2.8.

An evaluation sample was manufactured to measure a relative dielectric constant of a lamination structure including low dielectric constant films. This sample is a lamination of a lower low dielectric constant film of 300 nm in thickness, an upper low dielectric constant film of 300 nm in thickness and a silicon oxide film of 50 nm in thickness made of TEOS, respectively stacked upon a silicon substrate. An Au film having a diameter of 1 mm and a thickness of 100 nm was formed on the surface of the uppermost silicon oxide film, and an electrostatic capacitance between the silicon substrate and Au film was measured. From this measurement result, a relative dielectric constant of the three-layer structure including the two low dielectric constant films and one silicon oxide film was calculated. The relative dielectric constant was 2.4. In contrast, a relative dielectric constant of a four-layer structure including two low dielectric constant films, one silicon nitride film having a thickness of 50 nm disposed between the low dielectric constant films and one silicon oxide film was 2.7. A silicon oxide film made of TEOS has a relative dielectric constant of about 4, and the silicon nitride film has a relative dielectric constant of about 7.

As seen from the tenth embodiment and the above-described evaluation results, if the etching stopper film made of silicon nitride is not disposed, a relative dielectric constant of a lamination structure including low dielectric constant films can be reduced.

The material of the upper low dielectric film may be: siloxane resin used by the tenth embodiment; resin produced by a sol-gel method using tetraalkoxysilane, trialkoxysilane, methyltrialkoxysilane or the like as source material; resin produced by a sol-gel method using a mixture of these source materials; resin produced by a sol-gel method using tetraalkoxysilane and dimethylalkoxysilane as source materials; or other resin. Ladder type resin may be hydrogen silsesquioxane, methylsilsesquioxane, fluorine-containing hydrogen silsesquioxane or the like.

The material of the lower low dielectric film may be: siloxane resin used by the tenth embodiment; and resin produced by a sol-gel method using phenyltrialkoxysilane. Ladder type resin may be phenylsilsesquioxane or the like. Resin containing a hydrocarbon group with 2 to 5 carbon atoms as at least one of side chains may be resin produced by a sol-gel method using at least one source material selected from a group consisting of ethyltrialkoxysilane, propyltrialkoxysilane, normal-butyltrialkoxysilane, and tertiary-butyltrialkoxysilane.

The present invention has been described in connection with the preferred embodiments. The invention is not limited only to the above embodiments. It is apparent that various modifications, improvements, combinations, and the like can be made by those skilled in the art.

What we claim are:

1. A semiconductor device comprising:
   a semiconductor substrate; and
   a dielectric film made of dielectric material containing siloxane resin and polycarbosilane bonded to the siloxane resin,
   wherein the siloxane resin contains a silanol group, a side chain of the polycarbosilane is hydrogen, and the siloxane resin and the polycarbosilane are bonded by reaction between the silanol group and the hydrogen.

2. The semiconductor device according to claim 1, wherein relative dielectric constant of the dielectric film is equal to or lower than 3.0.

3. The semiconductor device according to claim 2, wherein relative dielectric constant of the dielectric film is equal to or higher than 2.5.

* * * * *